(12) United States Patent
Pykäri et al.

(10) Patent No.: US 9,224,672 B1
(45) Date of Patent: Dec. 29, 2015

(54) THERMAL MANAGEMENT OF ELECTRONIC COMPONENTS

(71) Applicant: Microsoft Corporation, Redmond, WA (US)

(72) Inventors: Lasse Pykäri, Salo (FI); Ilkka J. Saarinen, Salo (FI); Matti T. Koskinen, Salo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/573,304

(22) Filed: Dec. 17, 2014

(51) Int. Cl.
*H01L 23/34* (2006.01)
*H01L 23/373* (2006.01)
*H01L 23/367* (2006.01)
*H01L 23/04* (2006.01)
*H01L 23/043* (2006.01)

(52) U.S. Cl.
CPC .............. *H01L 23/373* (2013.01); *H01L 23/04* (2013.01); *H01L 23/043* (2013.01); *H01L 23/367* (2013.01); *H01L 23/3733* (2013.01)

(58) Field of Classification Search
CPC . H01L 23/373; H01L 23/3733; H01L 23/367; H01L 23/04; H01L 23/043
USPC .......................................... 257/712, 719, 530
See application file for complete search history.

(56) References Cited

U.S. PATENT DOCUMENTS

| | | | |
|---|---|---|---|
| 5,294,826 A | 3/1994 | Marcantonio et al. | |
| 5,796,170 A | 8/1998 | Marcantonio | |
| 6,744,640 B2 | 6/2004 | Reis et al. | |
| 6,807,731 B2 | 10/2004 | Brandenburg et al. | |
| 7,169,643 B1 * | 1/2007 | Hashimoto | 438/110 |
| 7,262,369 B1 | 8/2007 | English | |
| 7,298,047 B2 | 11/2007 | Kawakami et al. | |
| 7,463,496 B2 | 12/2008 | Robinson et al. | |
| 7,965,514 B2 | 6/2011 | Hill et al. | |
| 8,021,930 B2 | 9/2011 | Pagaila | |
| 8,077,479 B2 | 12/2011 | Ligtenberg | |
| 8,084,850 B2 | 12/2011 | Shin | |
| 8,143,108 B2 | 3/2012 | Pendse | |
| 2012/0320558 A1 | 12/2012 | Foster et al. | |

FOREIGN PATENT DOCUMENTS

WO 9623399 A1 8/1996

OTHER PUBLICATIONS

Kumar, Sundaram N, "Advances in Thermal Management Materials for RF and Digital Electronic Devices", Oct. 16, 2014 Available at: http://www.thermalnews.com/conferences/wp-content/uploads/2012/09/American-Standard-Circuits-Paper.pdf.

* cited by examiner

*Primary Examiner* — Tu-Tu Ho
(74) *Attorney, Agent, or Firm* — Judy Yee; Micky Minhas; Zete Law, P.L.L.C.

(57) ABSTRACT

An electronic device comprises a multi-layer printed circuit board. On the printed circuit board there is installed electronic components and a metal frame that encloses at least part of the electronic components. A layer of bonded anisotropic conductive film is disposed on the frame and the electronic components. The layer connects thermally a sheet of metal foil on the frame and on the electronic components. The sheet of metal foil covers the electronic component and the metal frame.

20 Claims, 6 Drawing Sheets

Side view

THERMAL MANAGEMENT OF ELECTRONIC COMPONENTS

BACKGROUND

Electronic components unavoidably produce heat as a byproduct in operating electronic systems. Heat is produced by active and passive electronic components in the form of dissipated power. The amount of power dissipated by an electronic component depends on the geometry and type of the electronic component. In most cases the primary source of heat is resistance which is the opposition to the passage of an electric current through conductors comprised in an electronic component. Heat is produced by resistors, non-ideal capacitors, inductors, transistors, integrated circuits and electrical conductors between such components. Heat is also produced by the substrate in integrated circuits. The heat increases the operating temperature of the electronic components and the overall temperature in the device in which the electronic components are used. An increased operating temperature reduces reliability of the device. The increased temperature also affects operating parameters of certain electronic components. Typically, the resistance of a resistor may change as a function of temperature. Also the gain of an amplifier is affected by the operating temperature. When a high-enough temperature is reached integrated circuits of the device may start to malfunction. The malfunctioning may first affect only specific types of integrated circuits so that the malfunctioning may first appear as subtle bugs in the device.

In order to protect against heating several solutions have been applied in computer and electronic systems. Previously, active water cooling has been used to cool processor boards. In current blade servers and tower servers fan trays with a plurality of fans have been used. However, such solutions are usually unavailable when the device needs to be miniaturized. Many table computers and laptop computers employ a finned heat sink which is installed on top of a microprocessor or a chipset from which heat must be dissipated. The fins achieve effective heat dissipation due to a large dissipation surface to volume ratio.

The embodiments described below are not limited to implementations which solve any or all of the disadvantages of known mobile devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An electronic device is built on a multi-layer printed circuit board. On the multi-layer printed circuit board there are installed electronic components. The electronic components are enclosed by a metal frame installed on the printed circuit board. There is a layer of bonded anisotropic conductive film on the frame and on the electronic components. The layer of bonded anisotropic conductive film connects thermally a sheet of metal foil on the metal frame and the electronic components. The sheet covers the electronic components and the metal frame.

In a method there are installed electronic components on a multi-layer printed circuit board. A metal frame is installed on the printed circuit board that encloses the electronic components. A layer of anisotropic conductive film is added on the metal frame and on the electronic components, wherein a sheet of metal foil is arranged on the layer of anisotropic conductive film to cover the electronic components and on the metal frame. Thereupon, a first pressure is applied on the sheet in an area comprising the electronic components to fix the sheet on the layer of anisotropic conductive film on the electronic components. Thereupon, a second pressure is applied on the sheet in an area covering the metal frame to fix the sheet on the layer of anisotropic conductive film on the metal frame thereby bonding the layers of anisotropic conductive film to form a thermal connection of the at least one electronic component to the metal frame via the sheet of metal foil.

Many of the attendant features will be more readily appreciated as they become better understood by reference to the following detailed description which is considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. However, the same or equivalent functions and sequences may be accomplished by different examples.

Although the present examples are described and illustrated herein as being implemented in an electronic device with a printed circuit board, the device described is provided as an example and not a limitation. As those skilled in the art will appreciate, the present examples are suitable for application in a variety of different types of circuit boards, e.g. in stripboards, veroboards, flexible printed circuit boards, printed electronic boards and wearable computer boards.

Figure 1A:
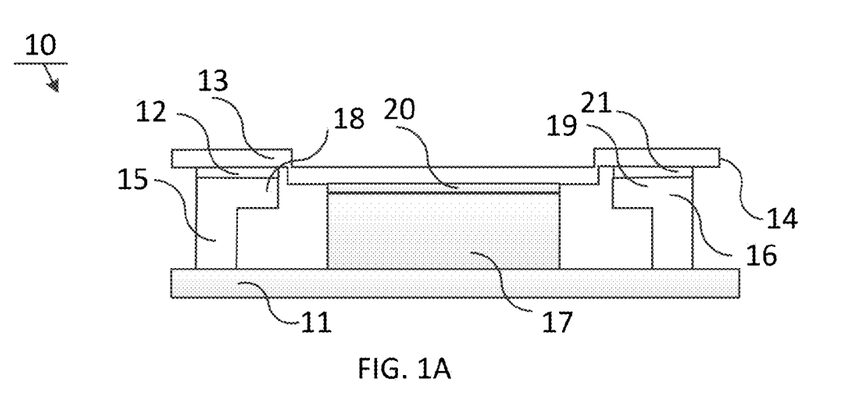
FIG. 1A illustrates a cross-section of an electronic component enclosed by a frame on a printed circuit board and covered by a metal foil in an embodiment.

FIG. 1A illustrates a cross section an electronic component enclosed by a frame on a printed circuit board and covered by a metal foil in an embodiment. There is a Printed Circuit Board (PCB) 11. On PCB 11 there is attached a metal frame, which appears in the form of a metal wall 15 of the metal frame and a metal wall 16 of the metal frame in the cross section of FIG. 1A. Metal walls 15 and 16 and the frame may be made of alpaca. Metal walls 15 and 16 of the metal frame may have metal shoulders 18 and 19, respectively. Metal walls 15 and 16 may comprise orifices or openings to allow air circulation while still contributing to a Faraday cage effect. On PCB 11 there is an electronic component 17 enclosed or encircled by the metal frame. Electronic component 17 may comprise at least one integrated circuit. Electronic component 17 may comprise a chip or a chipset. The frame may enclose other electronic components (not shown). The electronic components enclosed may have the same height as electronic component 17 or their height may be increased with a thermal interface material to have the same height. On metal wall 15 there is a layer 12 of bonded Anisotropic Conductive Film (ACF). On metal wall 16 there is a layer 21 of bonded ACF. On electronic component 17 there is also a layer 20 of bonded ACF. The bonded ACF layers on the frame and on electronic component 17 are used to fix a metal foil sheet 13 on the frame and on electronic component 17. The metal foil may be made of at least one of copper, aluminum, silver or alpaca. It is to be understood that the ACF layers 12, 20 and 21 may be connected with each other forming a single layer integrated under the metal foil sheet 13.

It is to be understood that although height of the metal frame is illustrated to be higher than that of the electronic component 17 in FIG. 1a, the heights may alternatively be substantially equal. This applies to examples of FIGS. 1b-4 also.

The thickness of the metal walls of the metal frame may be between 100 μm and 200 μm. In an embodiment the thickness of the metal walls of the metal frame may be between 145 μm and 155 μm. The thickness of the sheet of metal foil may be between 5 μm and 125 μm, based on the thermal mass and energy. The metal frame may be made of alpaca or copper. The thickness of the ACF layer may be e.g. up to 45 μm initially, i.e. before applying pressure and/or heat on the ACF layer in the ACF bonding process.

The metal foil and the metal frame serve the purpose of Radio Frequency (RF) shielding. Thickness of the shielding may be selected based on RF/EMI attenuation needs. The metal foil and the metal frame also serve the purpose of heat management. The use of a metal foil assists in miniaturizing the electronic device in which PCB 11 is used. In an embodiment, the metal foil allows the metal foil to conform to various heights of various electronic components on PCB 11. There is no need to have a rigid cover on the metal frame that does not conform to the different heights of the electronic components on PCB 11.

Furthermore, unlike with shielding cans, there is no need for an air gap between the electronic component(s) and the metal foil sheet. This provides remarkable thickness reduction (e.g. 0.30-0.35 mm) over metal shielding cans.

The sheet of metal foil may extend on at least one side over the metal frame to form a stripe or an edge of the metal foil. The stripe or the edge may be also connected to the metal foil with bonded ACF. The stripe or the edge may be thermally connected to a heat sink (not shown) on PCB 11. The heat sink may, for example, comprise a finned heat sink or at least one copper layer in PCB 11. If PCB 11 is a multilayer PCB, it may comprise at least two copper layers, which may be connected thermally in PCB 11 by means of at least one thermal via or a copper barreled via. The stripe or the edge may be thermally connected to the heat sink using, for example, soldering, ACF bonding with copper particles or copper coated particles, screwing or mechanical compression. The stripe or the edge may be connected to a copper layer in PCB 11, for example, with a solder ball, a mass of bonded ACF placed in a via leading to the copper layer. The bonded ACF may have copper, nickel and/or tin particles or copper, nickel and/or tin coated particles. The copper layers to which the stripe or the edge is thermally connected are assumed to comprise a sufficient cooling mass that compensates for the heat produced by electronic component 17.

Figure 1B:
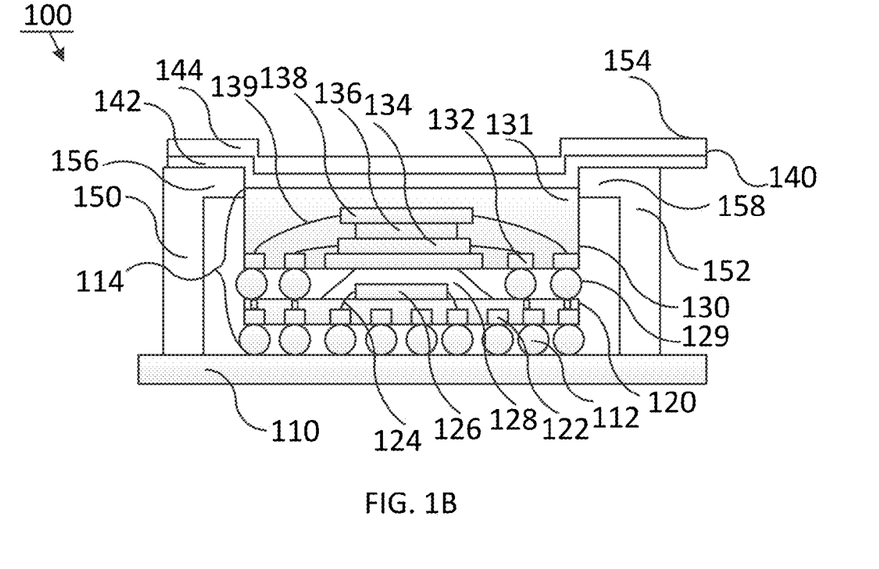
FIG. 1B illustrates a cross-section of a framed package-on-package stack on a printed circuit board and covered by a metal foil in an embodiment.

FIG. 1B illustrates a cross-section of a framed package-on-package stack on a printed circuit board and covered by a metal foil in an embodiment.

There is a Printed Circuit Board PCB 110. On PCB 110 there is attached a Package-On-Package (POP) stack 114. A first layer substrate 120 of POP stack 114 is attached on PCB 110 with a first Ball Grid Array (BGA) 112 of solder balls. The solder balls have been heated, for example, in a reflow oven or by an infrared heater to render the solder balls electrically conductive. Underneath first layer substrate 120 and on top of first BGA 112 there is a first array of pads 122 which faces first BGA 112. To a subset of pads in first array of pads 122 there may be connected gold wires, such as gold wire 124, which are connected to die 126. Die 126 and the gold wires connecting to it are covered by cured resin 128. A subset of pads in first array of pads 122 may have vias which lead to corresponding pads on the other side of first layer substrate 120. Typically, the subset of pads is arranged on edges of first layer substrate 120 to leave sufficient area for die 126.

Below first BGA 112 there is a second array of pads (not shown) electrically connected to an array copper leads (not shown) in at least one copper layer of PCB 110. Pads electrically connected to an intermediate layer in PCB 110 may have a via leading to the intermediate layer. A second layer substrate 130 is attached to first layer substrate 120 with a second BGA 129 of solder balls. Underneath second layer substrate 130 on top of second BGA 129 there is a third array of pads 132. To a subset of pads in the third array of pads 132 there are connected gold wires such as gold wire 139 which are connected to one of die 134, die 136 or die 138 stacked on second layer substrate 130. Dies 134, 136, 138 and the gold wires are covered with cured resin 131.

On PCB 110 there is attached a metal frame, which appears in the form of a metal walls 150 and 152 of the metal frame in the cross section of FIG. 1B. The metal frame encloses or encircles POP stack 114. Metal walls 150 and 152 and the metal frame may be made of alpaca. The thickness of the metal walls of the metal frame may be between 100 μm and 200 μm. In an embodiment the thickness of the metal walls of the metal frame may be between 145 μm and 155 μm. Metal walls 150 and 152 of the metal frame may have metal shoulders 156 and 158, respectively. The shoulders may act as a support for a cover for the metal frame. Metal shoulders 156 and 158 may be parts of a uniform flange on the metal frame. Metal walls 150 and 152 may comprise orifices or openings to allow air circulation while still contributing to a Faraday cage effect.

On the metal frame there is a layer of bonded ACF 142. The layer of bonded ACF also covers topmost cured resin 131 layer of POP stack 114. The layer of bonded ACF comprises e.g. copper, nickel and/or tin particles or copper, nickel and/or tin coated particles which improve heat conductivity in relation to ACF particle materials such as Nickel and Gold coated particles. However, it is to be understood that any metal particle forms and types can be used. Particles may be selected based on the application needs. In one embodiment, there may be separate layers of bonded ACF 142 on the metal frame and on POP stack 114. This may be the case if there is a space in the horizontal direction between the metal frame and POP stack 114. Layer of bonded ACF 142 is used to affix a sheet of metal foil 144 on POP stack 114 and on the metal frame. The metal foil may be made of at least one of copper, aluminum, silver or alpaca. The thickness of the metal foil may be between 5 µm and 125 µm. The thickness of the ACF layer may be e.g. up to 45 µm initially, i.e. before applying pressure and/or heat on the ACF layer in the ACF bonding process.

Metal foil 144 and the metal frame may serve the purpose of Radio Frequency (RF) shielding. Metal foil 144 and the metal frame may also serve the purpose of heat management and dissipating heat from POP stack 114 to a heat sink.

The metal foil 144 as well as layer of bonded ACF 142 may extend on at least one side over the metal frame to form an edge or margin 154. Edge 154 may be thermally connected to a heat sink (not shown), which may be on PCB 110 or which may be part of PCB 110. The heat sink may, for example, comprise a finned heat sink or at least one copper layer in PCB 110. If PCB 110 is a multilayer PCB, it may comprise at least two copper layers, which may be connected thermally in PCB 110 by means of at least one thermal via. Edge 154 may be thermally connected to the heat sink using, for example, soldering, ACF bonding with copper particles or copper coated particles, screwing or mechanical compression. Edge 154 may be connected (not shown) to a copper layer in PCB 110, for example, with a solder ball, a mass of bonded ACF placed in a via leading to the copper layer. The copper layer may be further connected to another copper layer with a thermal via (not shown) in order to increase cooling mass of the copper layer acting as a heat sink. The copper layers to which edge 154 is thermally connected are assumed to comprise a sufficient cooling mass that compensates for the heat produced by POP stack 114. Edge 154 may also be thermally connected to a housing component of an electronic device comprising PCB 110. The housing component may be, for example, a frame of a display or a back cover. The ACF in this embodiment may use copper particles or copper coated particles.

Figure 2:
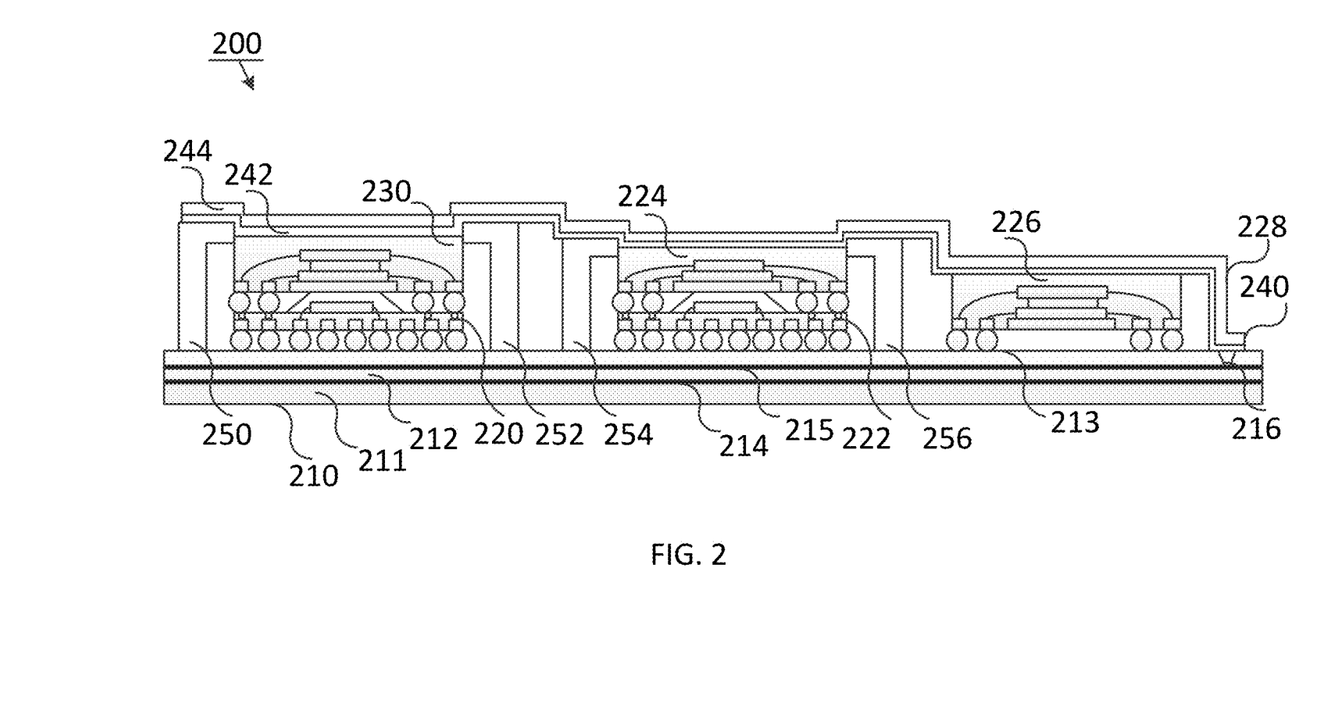
FIG. 2 illustrates a cross-section of two framed package-on-package stacks and an integrated circuit on a printed circuit board covered by a metal foil in an embodiment.

FIG. 2 illustrates a cross-section of two framed package-on-package stacks and an integrated circuit on a printed circuit board. The two framed package-on-package stacks and the integrated circuit are covered by a sheet of metal foil. In FIG. 2 there is a Printed Circuit Board (PCB) 210 which is a multi-layer printed circuit board. PCB 210 comprises intermediate electrically insulating layers 211, 212 and intermediate electrically conductive layers, such as copper layers 213, 214 and 215. Electrically conductive layer 213 comprises, for example, copper traces and pads for BGA solder balls on PCB 210. The pads may be electrically and thermally connected to an inner layer of PCB 210 through copper barreled blind vias.

There is a first Package-on-Package (POP) stack 220 and a second Package-on-Package (POP) stack 222 and a chip package 226 attached on multi-layer Printed Circuit Board (PCB) 210. First POP stack 220 and second POP stack 222 and chip package 226 are attached to PCB 210 with respective Ball Grid Arrays (BGA) of solder balls on PCB 210 that are melted in order to render the solder balls conductive. In place of chip package 226 may also be used a third POP stack (not shown). The number of POP stacks and chip packages in FIG. 2 is just for illustrative purposes. Instead of a BGA an array of pins may be used to attach a POP stack to PCB 210.

First POP stack 220 is enclosed or encircled by a first metal frame illustrated in FIG. 2 as metal walls 250 and 252 of the frame. Second POP stack 222 is enclosed or encircled by a second metal frame illustrated in FIG. 2 as metal walls 254 and 256 of the second frame. The first metal frame and the second metal frame may be made of alpaca.

In FIG. 2 on top of first POP stack 220 and the first metal frame, on top of second POP stack 222 and second metal frame, and on top of chip package 226 there is a layer of bonded ACF 242, which is used to affix a sheet 244 of metal foil on the bonded layer of ACF 242. Bonded layer of ACF 242 comprises e.g. copper, nickel and/or tin particles or copper, nickel and/or tin coated particles which improve heat conduction in the bonded ACF material. In an embodiment, there are separate layers of bonded ACF on the first frame, first POP stack 220, the second frame, second POP stack 224 and chip package 226 which are used to affix thereon sheet 244. The bonded ACF may also in this case comprise e.g. copper, nickel and/or tin particles or copper, nickel and/or tin coated particles.

Sheet 244 has a margin 228 which is bent to contact PCB 210 on area 240. Sheet 244 is affixed on PCB 210 on area 240 with bonded ACF comprising e.g. copper, nickel and/or tin particles or copper, nickel and/or tin coated particles. In area 240 on PCB 210 there is a channel 216 for heat which leads to copper layer 215 which acts as a heat sink. Channel 216 may be a thermal via or a copper barreled blind via that conducts heat from sheet 244 to copper layer 215. Copper layer 215 may be connected to copper layer 214 by means of a plurality of thermal vias or a plurality copper barreled vias (not shown). Therefore, cooling mass of the heat sink for sheet 244 is increased.

There may be more than one electronic components, and one sheet of metal foil that can be easily cut to meet the required space and that can be used to act also as a thermal conductor to the sink thus enabling the cooling of the electronic components and spreading the heat, thus not causing, e.g., the cover of the device to heat on a single point.

In an embodiment, margin 228 or sheet 244 may also be connected to other types of heat sinks such as a housing component of an electronic device comprising PCB 210. The housing component may be, for example, a frame of a display or a back cover. In an embodiment, electronic device comprising PCB 210 is a computer device, for example, a mobile terminal or a smartphone.

In an embodiment, metal walls 250, 252, 254 and 256 and the metal frame may be made of alpaca or copper. The thickness of the metal walls of the metal frame may be between 100 µm and 200 µm. In an embodiment the thickness of the metal walls of the metal frame may be between 145 µm and 155 µm. Metal walls 250, 252, 254 and 256 of the frame may have metal shoulders, which may act as a support for a cover for the metal frame. Metal shoulders may be parts of a uniform shoulder on the frame. Metal walls 250, 252, 254 and 256 may comprise orifices or openings to allow air circulation while still contributing to a Faraday cage effect. The sheet of metal foil may be made of at least one of copper, aluminum, silver or alpaca. The thickness of the metal foil may be between 5 µm and 125 µm. The ACF in this embodiment may use copper, nickel and/or tin particles or copper, nickel and/or tin coated particles.

The metal foil and the first and second metal frames may serve the purpose of Radio Frequency (RF) shielding. The metal foil and the first and the second metal frames may also serve the purpose of heat management. The use of a metal foil assists in miniaturizing the electronic device in which PCB 210 or PCB 110 is used. In an embodiment, the thickness of the metal foil between e.g. 5 µm and 125 µm allows the metal foil to conform to various heights of various electronic components on PCB 210 or PCB 110. There is no need to have a rigid cover on the first and second metal frames that does not conform to the different heights of the electronic components on PCB 210 or PCB 110 within the metal frames. The lack of conforming allows the placement of other electronics components or mechanical components on or over sheet 244 in a space that has been saved due to the lack of conforming. For example, a center section of a metal frame covered with sheet 244 may have an electronic component that has a top surface a few millimeters lower than the metal frame. The spared millimeters may be used to house a mechanical or electronic component or wiring.

Figure 3:
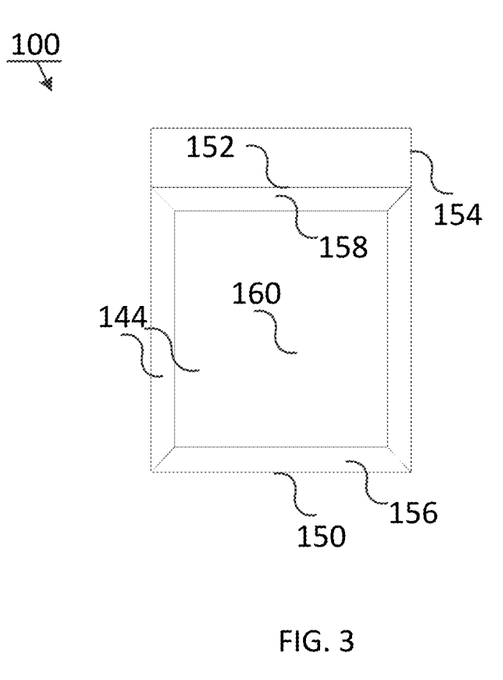
FIG. 3 illustrates the framed package-on-package stack covered by the metal foil as viewed from above in an embodiment.

FIG. 3 illustrates the framed package-on-package stack covered by the metal foil as viewed from above in an embodiment. In FIG. 3 the area of the metal frame of FIG. 1B is illustrated with areas of metal shoulders 156 and 158. The area of POP stack 114 is illustrated with area 160. In FIG. 3 the area and the shape of the sheet of metal foil is just for purposes of illustration and may vary in different embodiments.

Figure 4:
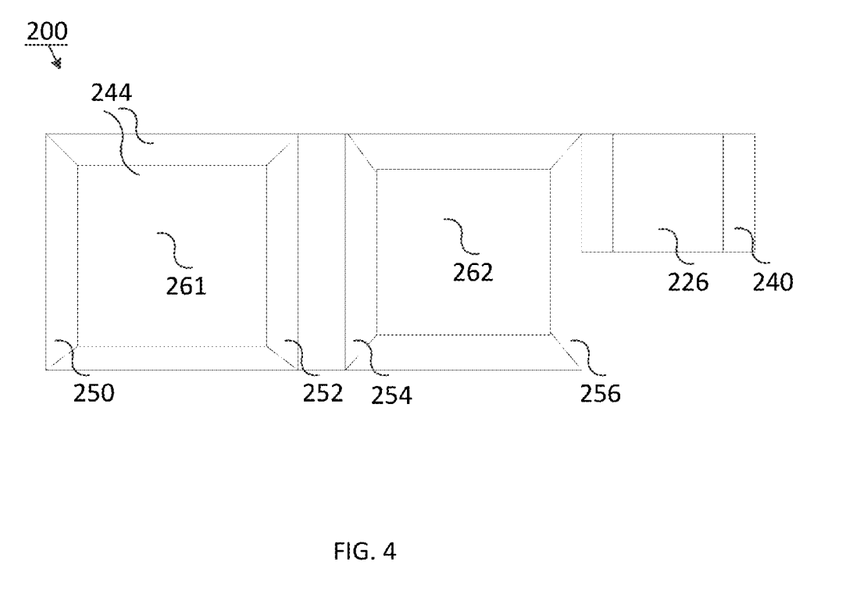
FIG. 4 illustrates the two framed package-on-package stacks and an integrated circuit on a printed circuit board covered by a metal foil as viewed from above in an embodiment.

FIG. 4 illustrates the two framed package-on-package stacks and an integrated circuit on a printed circuit board covered by a metal foil as viewed from above in an embodiment. In FIG. 4 the area of the first metal frame is illustrated with areas of metal walls 250 and 252, whereas the area of the second metal frame is illustrated with areas of metal walls 254 and 256. The area of first POP stack 220 is illustrated as area 261. The area of second POP stack 222 is illustrated as area 262. The area of chip package 226 and the area of sheet 244 bent an area of PCB 228 are also illustrated. In FIG. 4 the area and the shape of the sheet 244 of metal foil is just for purposes of illustration and may vary in different embodiments.

Figure 5:
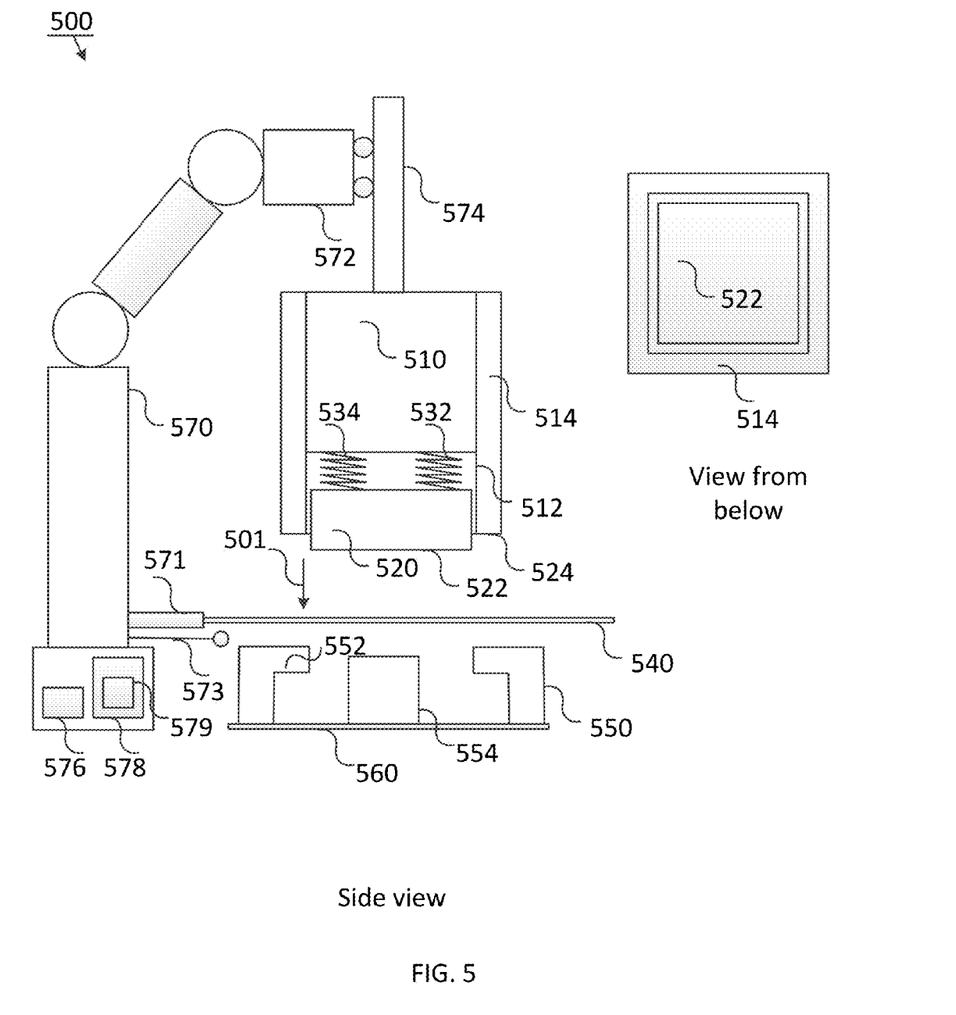
FIG. 5 illustrates a cross-section of a pressure applying tool for fixing a metal foil on anisotropic conductive film layers applied on a metal frame and at least one electronic component on a printed circuit board.

FIG. 5 illustrates a cross-section of a pressure applying tool for fixing a metal foil on anisotropic conductive film layers applied on a metal frame and on at least one electronic component on a printed circuit board.

In FIG. 5 there is a pressure applying tool 500. The pressure applying tool comprises a hollow square cylinder 512 which has walls 514 surrounding the cylinder 512. In one end of the cylinder there is a body 510 mounted to walls 514. To body 510 are mounted springs 532 and 534. Springs 532 and 534 allow a piston 520 to move in cylinder 512 between a compressed position, where piston 520 is pushed completely into cylinder 512 so that surface 522 of the piston facing out of cylinder 512 is aligned vertically on the level of bottom surface of cylinder 524, and an extended position where piston 520 extends out of cylinder 512 vertically and springs 532 and 534 are at rest state.

Pressure applying tool 500 is suitable for pushing a sheet 540 of metal foil to contact ACF coated surface of a metal frame having walls 550 and 552, and pushing sheet 540 to contact ACF coated surface of an electronic component 554 on a printed circuit board 560. Electronic component 554 is enclosed by the metal frame. The act of pushing is illustrated with arrow 501. The pushing is achieved with an actuator mechanism 572 which controls a height an actuator shaft 574. To the lower end of actuator shaft 574 there is mounted pressure applying tool 500. The horizontal alignment of pressure applying tool 500 is controlled with a robot arm 570 controlled by a processor 576 having a memory 578. To the memory 578 there is stored a computer program 579, which when executed by processor 576, controls robot arm 570, actuator 572 and ACF dispenser or spreader 573. Computer program 579 may also control a heater 580 for ACF bonding communicatively connected to processor 576. Computer program 579 also controls an alignment arm 571. Computer program 579 also controls an ACF dispenser or spreader 573 which applies ACF on the metal frame and electronic component 554. Alternatively, instead of applying ACF on the metal frame and electronic component 554, the ACF may be arranged on the bottom surface of the sheet 540 of metal foil.

Before pushing, cylinder walls 514 of pressure applying tool 500 are aligned with the metal frame by robot arm 570 based on instructions from computer program 579. Sheet 540 is also aligned to a desired position relative to the metal frame. The alignment of sheet 540 is performed with an alignment arm 571 also controlled by processor 576 when processor 576 executes computer program 579.

Due to the fact that piston 520 extends out of cylinder 514, pressure applying tool 500 first pushes sheet 540 in contact with ACF coated electronic component 554 with piston 520. In response thereto, sheet 540 becomes affixed to electronic component 554 and does not slide any more horizontally. When pressure applying tool 500 is brought lower step-by-step, the pressure by which sheet 540 is pushed by piston 520 against ACF coated electronic component 554 further increases. Ultimately, pressure applying tool 500 is brought lower to a vertical level on which bottom surface 524 of cylinder walls 514 pushes sheet 540 in contact with the ACF coated metal frame having walls 550 and 552.

Pressure applying tool 500 is movable between an upper position, an intermediate position and a lower position with actuator 572 and actuator shaft 574 to which pressure applying tool 500 is mounted. In the intermediate position pressure applying tool 500 first pushes sheet 540 in contact with ACF coated electronic component 554 with bottom surface 522 of piston 520 with a first pressure. In the lower position pressure applying tool 500 pushes sheet 540 in contact with the ACF coated metal frame having walls 550 and 552 with bottom surface 524 of cylinder 514 walls with a second pressure. The second pressure differs from the first pressure if the springs 532 and 534 are not completely compressed when piston 520 is completely inside cylinder 514.

When sheet 540 is in contact with ACF on the metal frame and on electronic component 554. ACF may be bonded by heating with a heat tool comprised e.g. in outer edges of the piston 520. Accordingly, the piston 520 serves as an ACF bonding tool applying both pressure and heat.

Figure 6:
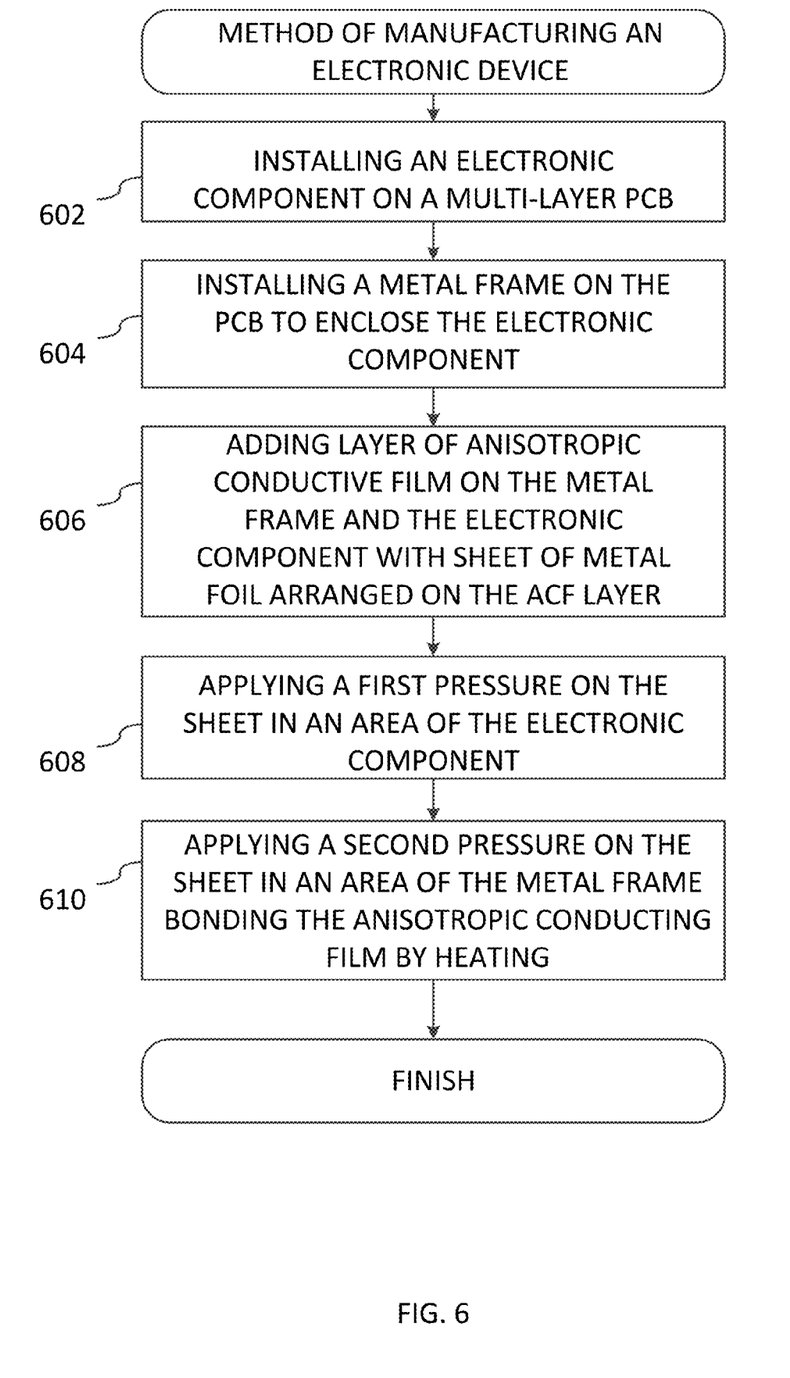
FIG. 6 is a flowchart illustrating a method of manufacturing of an electronic device with a metal foil affixed on a metal frame on a printed circuit in an embodiment.

FIG. 6 is a flowchart illustrating a method of manufacturing of an electronic device with a metal foil affixed on a metal frame on a printed circuit in an embodiment.

At step 602 there is installing at least one electronic component on a printed circuit board, which may be a multi-layer printed circuit board. The at least one electronic component comprise a package-on-package stack. The at least one electronic component may also comprise a chip package, for example, a flip chip. The at least one electronic component may also comprise an integrated circuit. The at least one electronic component may also comprise at least one of a capacitor, a resistor, an inductor and an active device.

At step 604 there is installed a metal frame on the printed circuit board that encloses the at least one electronic component. The metal frame may have the same height as the at least one electronic component. The height of an electronic component may be increased with a thermal interface material such as thermal grease. Thermal grease consists of a liquid matrix that may be polymerized and large volume fractions of electrically insulating, but thermally conductive filler.

At step 606 a first layer of anisotropic conductive film is added on the metal frame and the at least one electronic component, wherein a sheet of metal foil is arranged on the first layer of anisotropic conductive film. In an embodiment, the arrangement of the sheet of metal foil on the first layer of anisotropic conductive film is performed by laminating or otherwise attaching the ACF layer on one side of the sheet of metal foil beforehand. Then, this ready-made structure is arranged on the metal frame with the ACF layer downwards to allow it to come into contact with the metal frame. In another embodiment, the arrangement of the sheet of metal foil on the first layer of anisotropic conductive film is performed by laminating or otherwise attaching the ACF layer over the metal frame. Then, the sheet of metal foil is arranged over the ACF layer. In yet another embodiment, the ACF layer initially comprises dots of anisotropically conductive paste (ACP). The arrangement of the sheet of metal foil on the first layer of anisotropic conductive film is performed by first dispensing dots of ACP over the metal frame. Then, the sheet of metal foil is arranged over the ACP dots.

At step 608 a first pressure is applied uniformly on the sheet in an area where the sheet covers the at least one electronic component to fix the sheet on the first layer of anisotropic conductive film on the at least one electronic component.

At step 610 a second pressure is applied uniformly on the sheet in an area covering the metal frame to fix the sheet on the first layer of anisotropic conductive film on the metal frame, thereby bonding the first layer of anisotropic conductive film to form a thermal connection of the at least one electronic component to the metal frame via the sheet of metal foil.

In an embodiment, the bonding is further achieved by heating the sheet to a temperature that may be, for example, between 130° C. and 200° C. The temperature may vary depending on the adhesive type.

In an embodiment, the ACF layer may comprise anisotropically conductive paste (ACP).

Thereupon, the method may be finished. In an embodiment, the method steps may be executed in the numeric order of the reference numerals.

In an embodiment, the method may be repeated for each metal frame enclosed electronic component on the printed circuit board.

There is presented an electronic device, a method and a computer program.

There is an electronic device comprising: a multi-layer printed circuit board; at least one first electronic component installed on the printed circuit board; a first metal frame installed on the printed circuit board, the first metal frame enclosing the at least one electronic component; and a first layer of bonded anisotropic conductive film on the first metal frame and the at least one first electronic component connecting thermally a sheet of metal foil on the first metal frame and on the at least first one electronic component, the sheet covering the at least one first electronic component and the first metal frame.

There is a method which comprises: adding a first layer of anisotropic conductive film on a metal frame and the at least one electronic component, the metal frame enclosing the electronic component, the metal frame and the electronic component being attached on a printed circuit board, wherein a sheet of metal foil is arranged on the first layer of anisotropic conductive film; applying a first pressure on the sheet in an area covering the at least one electronic component to fix the sheet on the first layer of anisotropic conductive film on the at least one electronic component; applying a second pressure on the sheet in an area covering the metal frame to fix the sheet on the first layer of anisotropic conductive film on the metal frame thereby bonding the first layer of anisotropic conductive film to form a thermal connection of the at least one electronic component to the metal frame via the sheet of metal foil.

There is a computer program stored on a computer readable medium, the computer program comprising code adapted to cause the following when executed on a data-processing system: adding first layers of anisotropic conductive film on the metal frame and the at least one electronic component, respectively, the metal frame enclosing the electronic component, the metal frame and the electronic component being attached on a printed circuit board, wherein a sheet of metal foil is arranged on the first layer of anisotropic conductive film; applying a first pressure on the sheet in an area covering the at least one electronic component to fix the sheet on the first layer of anisotropic conductive film on the at least one electronic component; applying a second pressure on the sheet in an area covering the metal frame to fix the sheet on the first layer of anisotropic conductive film on the metal frame thereby bonding the first layer of anisotropic conductive film to form a thermal connection of the at least one electronic component to the metal frame via the sheet of metal foil.

In an embodiment, the computer readable medium comprises at least one of a static random access memory, a read-only memory, a mask read-only memory, a non-volatile random-access memory, an electrically erasable programmable read-only memory, a flash memory, a magnetic or optic disk, a removable memory module, a removable memory card and a Magnetoresistive random access memory.

In an embodiment, the at least one first electronic component comprises an integrated circuit. The integrated circuit may comprise a package-on-package. The integrated circuit may comprise a chip package comprising at least two package layers covered by an electrically insulating cured resin mold.

In an embodiment, the first frame is suitable for radio-frequency shielding.

In an embodiment, the first layer of bonded anisotropic conductive film comprises at least one of copper, nickel and tin particles or at least one of copper, nickel and tin coated particles.

In an embodiment, the electronic device further comprises at least one second electronic component installed on the printed circuit board, a second metal frame installed on the printed circuit board, the second metal frame enclosing the at least one second electronic component, and a second layer of bonded anisotropic conductive film on the second frame and the at least one second electronic component connecting thermally a sheet of metal foil on the second frame and on the at least one second electronic component, the sheet also covering the at least one second electronic component and the first frame.

In an embodiment, the first frame and the second frame are suitable for radio-frequency shielding.

In an embodiment, the first layer and/or the second layer of bonded anisotropic conductive film comprise copper particles or copper coated particles.

In an embodiment, a height of the second metal frame is different from the height of the first metal frame.

In an embodiment, the at least one second electronic component comprises an integrated circuit.

In an embodiment, the integrated circuit comprises a chip package comprising at least two package layers covered by an electrically insulating cured resin mold.

In an embodiment, the second frame is suitable for radio-frequency shielding.

In an embodiment, the electronic device further comprises at least one third electronic component, a third layer of bonded anisotropic conductive film thermally connecting the sheet of metal foil on the at least one third electronic component, the sheet also covering the at least one third electronic component.

In an embodiment, the at least one third electronic component comprises an integrated circuit.

In an embodiment, the integrated circuit comprises a chip package.

In an embodiment, the integrated circuit comprises a flip chip.

In an embodiment, the sheet is thermally connected to a heat sink.

The heat sink may comprise at least one copper layer in the printed circuit board. The heat sink may also comprise a cover or a cover component of the electronic device, for example, a back cover or a display frame. The cover or the cover component may be made of aluminum or copper.

In an embodiment, the heat sink comprises at least one copper layer of the printed circuit board.

In an embodiment, the sheet is attached with at least one spot of bonded anisotropic conductive film on a thermal via of the printed circuit board, the at least one the thermal via being thermally connected to a copper layer of the multi-layer printed circuit board.

In an embodiment, the sheet is made of at least one of copper foil, aluminum foil and alpaca foil. The foil may have a thickness between 5 μm and 125 μm.

There is an electronic device which comprises a multi-layer printed circuit board, at least one first electronic component installed on the printed circuit board and a first metal frame installed on the printed circuit board, the first metal frame enclosing the at least one electronic component. The electronic device is characterized in that a first layer of bonded anisotropic conductive film on the first frame and the at least one first electronic component connects thermally a sheet of metal foil on the first frame and on the at least first one electronic component, the sheet covering the at least one first electronic component and the first frame.

There is a method for attaching a thermally conductive shield on a printed circuit board. The method is characterized in that it comprises: adding a first layer of anisotropic conductive film on a metal frame and the at least one electronic component, the metal frame enclosing the electronic component, the metal frame and the electronic component being attached on a printed circuit board, wherein a sheet of metal foil is arranged on the first layer of anisotropic conductive film; applying a first pressure on the sheet in an area covering the at least one electronic component to fix the sheet on the first layer of anisotropic conductive film on the at least one electronic component; applying a second pressure on the sheet in an area covering the metal frame to fix the sheet on the first layer of anisotropic conductive film on the metal frame thereby bonding the first layer of anisotropic conductive film to form a thermal connection of the at least one electronic component to the metal frame via the sheet of metal foil.

There is a computer program stored on a computer readable medium, the computer program comprising code. The computer program is characterized in that it is adapted to cause the following when executed on a data-processing system: adding a first layer of anisotropic conductive film on the metal frame and the at least one electronic component, the metal frame enclosing the electronic component, the metal frame and the electronic component being attached on a printed circuit board, wherein a sheet of metal foil is arranged on the first layer of anisotropic conductive film; applying a first pressure on the sheet in an area covering the at least one electronic component to fix the sheet on the first layer of anisotropic conductive film on the at least one electronic component; applying a second pressure on the sheet in an area covering the metal frame to fix the sheet on the first layer of anisotropic conductive film on the metal frame thereby bonding the first layer of anisotropic conductive film to form a thermal connection of the at least one electronic component to the metal frame via the sheet of metal foil.

The embodiments described hereinbefore may be used in any combination with each other. Several of the embodiments may be combined together to form a further embodiment. A method, an electronic device, a computer program or a computer program product may comprise at least one of the embodiments described hereinbefore. It is to be understood that any of the above embodiments or modifications can be applied singly or in combination to the respective aspects to which they refer, unless they are explicitly stated as excluding alternatives.

Alternatively, or in addition, the electronic components described herein can comprise, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), Graphics Processing Units (GPUs).

An example of the apparatus or a system described hereinbefore is a computing-based device comprising one or more processors which may be microprocessors, controllers or any other suitable type of processors for processing computer executable instructions to control the operation of the device in order to control one or more sensors, receive sensor data and use the sensor data. Platform software comprising an operating system or any other suitable platform software may be provided at the computing-based device to enable application software to be executed on the device.

The computer executable instructions may be provided using any computer-readable media that is accessible by computing based device. Computer-readable media may include, for example, computer storage media such as memory and communications media. Computer storage media, such as memory, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Therefore, a computer storage medium should not be interpreted to be a propagating signal per se. Propagated signals may be present in a computer storage media, but propagated signals per se are not examples of computer storage media. Although the computer storage media is shown within the computing-based device it will be appreciated that the storage may be distributed or located remotely and accessed via a network or other communication link, for example by using communication interface.

The computing-based device may comprise an input/output controller arranged to output display information to a display device which may be separate from or integral to the computing-based device. The display information may provide a graphical user interface, for example, to display hand gestures tracked by the device using the sensor input or for other display purposes. The input/output controller is also arranged to receive and process input from one or more devices, such as a user input device (e.g. a mouse, keyboard, camera, microphone or other sensor). In some examples the user input device may detect voice input, user gestures or other user actions and may provide a natural user interface (NUI). This user input may be used to configure the device for a particular user. In an embodiment the display device may also act as the user input device if it is a touch sensitive display device. The input/output controller may also output data to devices other than the display device, e.g. a locally connected printing device.

The term 'computer' or 'computing-based device' is used herein to refer to any device with processing capability such that it can execute instructions. Those skilled in the art will realize that such processing capabilities are incorporated into many different devices and therefore the terms 'computer' and 'computing-based device' each include PCs, servers, mobile telephones (including smart phones), tablet computers, set-top boxes, media players, games consoles, personal digital assistants and many other devices.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in a tangible storage media, but propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network).

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Any range or device value given herein may be extended or altered without losing the effect sought.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. An electronic device comprising:
   a multi-layer printed circuit board;
   at least one first electronic component installed on the printed circuit board;
   a first metal frame installed on the printed circuit board, the first metal frame enclosing the at least one electronic component; and
   a first layer of bonded anisotropic conductive film on the first metal frame and the at least one first electronic component connecting thermally a sheet of metal foil on the first frame and on the at least first one electronic component, the sheet covering the at least one first electronic component and the first metal frame.

2. The electronic device according to claim 1, wherein the at least one first electronic component comprises an integrated circuit.

3. The electronic device according to claim 2, wherein the integrated circuit comprises a chip package comprising at least two package layers covered by an electrically insulating cured resin mold.

4. The electronic device according to claim 1, wherein the first frame is suitable for radio-frequency shielding.

5. The electronic device according to claim 1, wherein the first layer of bonded anisotropic conductive film comprises at least one of copper nickel and tin particles.

6. The electronic device according to claim 1, the electronic device further comprising:
   at least one second electronic component installed on the printed circuit board;

a second metal frame installed on the printed circuit board, the second metal frame enclosing the at least one second electronic component; and a second layer of bonded anisotropic conductive film on the second frame and the at least one second electronic component connecting thermally a sheet of metal foil on the second frame and on the at least one second electronic component, the sheet also covering the at least one second electronic component and the first frame.

7. The electronic device according to claim 6, wherein a height of the second metal frame is different from the height of the first metal frame.

8. The electronic device according to claim 6, wherein the at least one second electronic component comprises an integrated circuit.

9. The electronic device according to claim 6, wherein the integrated circuit comprises a chip package comprising at least two package layers covered by an electrically insulating cured resin mold.

10. The electronic device according to claim 6, wherein the second frame is suitable for radio-frequency shielding.

11. The electronic device according to claim 1, the electronic device further comprising:

at least one third electronic component;

a third layer of bonded anisotropic conductive film thermally connecting the sheet of metal foil on the at least one third electronic component, the sheet also covering the at least one third electronic component.

12. The electronic device according to claim 11, wherein the at least one third electronic component comprises an integrated circuit.

13. The electronic device according to claim 12, wherein the integrated circuit comprises a chip package.

14. The electronic device according to claim 12, wherein the integrated circuit comprises a flip chip.

15. The electronic device according to claim 1, wherein the sheet is thermally connected to a heat sink.

16. The electronic device according to claim 15, wherein the heat sink comprises at least one copper layer of the printed circuit board.

17. The electronic device according to claim 16, wherein the sheet is attached with a spot of bonded anisotropic conductive film on a thermal via of the printed circuit board, the thermal via being thermally connected to a copper layer of the multi-layer printed circuit board.

18. The electronic device according to claim 1, wherein the sheet is made of at least one of copper foil, aluminum foil and alpaca foil, the foil having a thickness between 5 µm and 125 µm.

19. A method, comprising:

adding a first layer of anisotropic conductive film on a metal frame and at least one electronic component, the metal frame enclosing the electronic component, the metal frame and the electronic component being attached on a printed circuit board, wherein a sheet of metal foil is arranged on the first layer of anisotropic conductive film;

applying a first pressure on the sheet in an area covering the at least one electronic component to fix the sheet on the first layer of anisotropic conductive film on the at least one electronic component; and applying a second pressure on the sheet in an area covering the metal frame to fix the sheet on the first layer of anisotropic conductive film on the metal frame, thereby bonding the first layer of anisotropic conductive film to form a thermal connection of the at least one electronic component to the metal frame via the sheet of metal foil.

20. A computer program stored on a computer readable medium, the computer program comprising code adapted to cause the following when executed on a data-processing system:

adding a first layer of anisotropic conductive film on a metal frame and at least one electronic component, the metal frame enclosing the electronic component, the metal frame and the electronic component being attached on a printed circuit board, wherein a sheet of metal foil is arranged on the first layer of anisotropic conductive film;

applying a first pressure on the sheet in an area covering the at least one electronic component to fix the sheet on the first layer of anisotropic conductive film on the at least one electronic component; and applying a second pressure on the sheet in an area covering the metal frame to fix the sheet on the first layer of anisotropic conductive film on the metal frame, thereby bonding the first layer of anisotropic conductive film to form a thermal connection of the at least one electronic component to the metal frame via the sheet of metal foil.

\* \* \* \* \*